United States Patent
Joo et al.

(10) Patent No.: US 7,612,358 B2
(45) Date of Patent: Nov. 3, 2009

(54) NONVOLATILE NANOCHANNEL MEMORY DEVICE USING MESOPOROUS MATERIAL

(75) Inventors: Won Jae Joo, Hwaseong-si (KR); Jin Heong Yim, Suwon-si (KR); Kwang Hee Lee, Suwon-si (KR); Sang Kyun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 114 days.

(21) Appl. No.: 11/237,891

(22) Filed: Sep. 29, 2005

(65) Prior Publication Data

US 2006/0175653 A1    Aug. 10, 2006

(30) Foreign Application Priority Data

Feb. 7, 2005    (KR) ............... 10-2005-0011290

(51) Int. Cl.
*H01L 29/02* (2006.01)
(52) U.S. Cl. ............ 257/2; 257/3; 257/4; 257/5; 257/E29.002; 438/102; 438/103
(58) Field of Classification Search .......... 257/1–5, 257/9–12, 314, E29.002; 438/800, 900, 102, 438/103; 365/163
See application file for complete search history.

(56) References Cited

U.S. PATENT DOCUMENTS

| | | | |
|---|---|---|---|
| 6,055,180 A | 4/2000 | Gudesen et al. | |
| 6,172,902 B1 * | 1/2001 | Wegrowe et al. | 365/158 |
| 2002/0109134 A1 * | 8/2002 | Iwasaki et al. | 257/13 |
| 2002/0163057 A1 | 11/2002 | Bulovic et al. | |
| 2003/0166602 A1 | 9/2003 | Szoka, Jr. | |
| 2003/0170930 A1 * | 9/2003 | Choi et al. | 438/99 |
| 2005/0255581 A1 * | 11/2005 | Kim et al. | 435/287.2 |

FOREIGN PATENT DOCUMENTS

| | | | |
|---|---|---|---|
| JP | 62-095882 | | 5/1987 |
| TW | 2004132243 | * | 8/2004 |

OTHER PUBLICATIONS

Doudin et al. "Magnetic and Transport Properties of Electrodeposited Nanostructured Nanowires", IEEE Transactions on Magnetics, 34, 4, (1998), p. 968.*
*R.S. Potember et al, "Electrical Switching and Memory Phenomena in Cu-TCNQ Thin Films", Appl. Phys. Lett., Mar. 15, 1979, pp. 405-407, vol. 34, No. 6, American Institute of Physics.

(Continued)

Primary Examiner—Thanh V Pham
Assistant Examiner—Jami M Valentine
(74) Attorney, Agent, or Firm—Harness, Dickey & Pierce, P.L.C.

(57) ABSTRACT

A nonvolatile nanochannel memory device using a mesoporous material. Specifically, a memory device is composed of a mesoporous material that is able to form nanochannels, in which a memory layer having metal nanoparticles or metal ions fed into the nanochannels is disposed between an upper electrode and a lower electrode. Thus, the memory device has high processability, and manifests excellent reproducibility and uniform performance.

19 Claims, 11 Drawing Sheets

OTHER PUBLICATIONS

*Himadri S. Majumdar et al, "Conductance Switching and Data-Storage in Oriented Polymer-Based Devices: Impedance Characteristics", Thin Solid Films, 2004, pp. 296-300, vol. 446, Elsevier B.V.

*Himadri S. Majumdar et al., "Data-Storage Devices Based on Layer-By-Layer Self-Assembled Films of a Phthalocyanine Derivative", Organic Electronics, 2003, pp. 39-44, vol. 4, Elsevier Science B.V.

*Anirban Bandyopadhyay et al., "Large Conductance Switching and Memory Effects in Organic Molecules for Data-Storage Applications", Applied Physics Letters, Feb. 24, 2003, pp. 1215-1217, vol. 82, No. 8, American Institute of Physics.

Office Action dated May 9, 2008 from the Chinese Patent Office in a corresponding application (8 pages), including an English translation (7 pages).

* cited by examiner

AAO nanochannel

NONVOLATILE NANOCHANNEL MEMORY DEVICE USING MESOPOROUS MATERIAL

BACKGROUND OF THE INVENTION

This non-provisional application claims priority under 35 U.S.C. §119(a) on Korean Patent Application No. 2005-11290 filed on Feb. 7, 2005, which is herein incorporated by reference.

1. Field of the Invention

Embodiments of the present invention relate, generally, to nonvolatile nanochannel memory using a mesoporous material, and more particularly, to a memory device comprising a mesoporous material able to form nanochannels, in which a memory layer having metal nanoparticles or metal ions fed into the nanochannels is disposed between an upper electrode and a lower electrode.

2. Description of the Related Art

With the rapid development of the information and communication industries, the demand for various memory devices has drastically increased. In particular, memory devices required for portable terminals, various smart cards, electronic money, digital cameras, games, MP3 players, etc. must be nonvolatile so that the recorded information is not lost even when no power is consumed.

As techniques for large scale integration (LSI) have been developed, the number of bits of memory integrated in IC chips reaches the level of megabits, and thus, line and space widths having sub-micrometer sizes are required. Although almost all conventional nonvolatile memory devices are manufactured using standard silicon technology, the silicon based device thus manufactured has shortcomings, such as a complicated structure and a large sized single memory cell, and high capacity thereof cannot be realized. In order to manufacture silicon based memory having a high memory capacity with high integration, a fining process capable of decreasing line and space widths per unit area should be performed. This increases process costs and results in high costs of manufacturing memory chips. Moreover, the manufacturing techniques of the chips make it difficult to further miniaturize the chips, and hence, profitability problems are now being faced.

Therefore, vigorous attempts have been made to develop next-generation memory devices, which have ultrahigh speeds, high capacities and low power consumption suitable for the development of portable information and communication systems and apparatuses to wirelessly handle large amounts of information, instead of conventional memory devices. The next-generation memory devices include, for example, ferroelectric RAM, magnetic RAM, phase change RAM, nanotube RAM, holographic memory, organic memory, etc., depending on the kind of material constituting a unit cell in a semiconductor. Of these memory devices, organic memory achieves memory capability, using bistable resistance values obtained by applying voltage to an organic material provided between upper and lower electrodes. Thus, the organic memory can overcome the problems of processability, manufacturing costs and integration regarded as disadvantages of conventional flash memory, while unchangedly exhibiting the nonvolatile characteristics which are the advantage of flash memory. Therefore, organic memory is widely expected to be the next-generation memory technology.

In this regard, Potember, USA, in 1979, first reported a memory phenomenon, as well as electrical switching at a speed on the nano-second scale, using CuTCNQ (7,7,8,8-tetracyano-p-quinodimethane) as a charge transfer complex containing an organic metal [Appl. Phys. Lett., 34 (1979) 405]. Japanese Patent Laid-open Publication No. Sho. 62-956882 discloses an electrical memory device using CuTCNQ. However, the above memory device can be manufactured only by thermal deposition using an expensive evaporator, instead of a simple process such as spin coating, due to the use of the monomer, and hence, has no advantage in terms of processability.

As an organic material showing electrical bistability upon the application of an electrical field, conductive polymers other than a charge transfer material are also known [Thin Solid Film, 446 (2004) 296-300]. In addition, memory properties obtained by using a phthalocyanin based compound as an organic dye have been reported [Organic Electronics, 4(2003) 3944]. In addition, switching/memory properties due to conformational change under oxidation-reduction and electrical field are known [Applied Physics Letter, 82 (2003) 1215].

U.S. Pat. App. Pub. Serial No. 2002-163057 discloses a semiconductor device including a middle layer made of a mixture comprising an ionic salt such as NaCl or CsCl and a conductive polymer, interposed between upper and lower electrodes. Such a device manifests switching/memory properties using charge separation under an electrical field. Although the conductive polymer may be used for spin coating, its molecular weight and distribution are difficult to accurately control. Thus, reproducibility of the material is problematic, and uniform performance of the device cannot be realized.

In addition, U.S. Pat. No. 6,055,180 discloses a memory device using ferroelectricity depending on a crystalline phase of a fluorine based polymer, such as poly(vinyldifluoroethylene). However, the fluorine based polymer is difficult to apply due to hydrophobic properties of fluorine, thus having decreased processability. Also, the above patent is disadvantageous in that because the information may be recorded only once, and the stored information may be optically read, the size of the device increases and the structure thereof becomes complicated.

In addition, U.S. Pat. App. Pub. Serial No. 2003-166602 discloses a memory device including an active layer in which a plurality of nanochannels or pores for use in charge transfer are present, without the need of a conventional semiconductor material. However, the above device has a complicated structure, since the charge transfer path is formed of a polymer material and an inactive layer for supplying ions must be present along with the active layer to change the electrical conductivity of the active layer.

Further, a memory device manufactured by Y. Yang who is a professor at UCLA, USA, by positioning thin metal nanoclusters between two organic layers has been reported to have excellent memory properties, which may be understood based on the change of the overall resistance of the device via charge/discharge of the metal nanoclusters functioning as a capacitor, or based on an MIM (Metal/Insulator/Metal) memory phenomenon proposed by J. G. Simmons and R. R. Verderber. In addition, IBM has manufactured a memory device exhibiting an MIM memory phenomenon, using gold particles dispersed in a polymer. As such, the above memory device is characterized in that the gold particles function as a current flow channel.

As mentioned above, the conventionally used organic material having bistability is disadvantageous because it is deposited only by thermal deposition using an expensive evaporator, instead of a simple process such as spin coating, due to the use of the monomer. The conductive polymer may undergo spin coating, however accurate molecular weight and distribution thereof are difficult to obtain. Thus, the reproducibility of the material is problematic, resulting in nonuniform performance of the device. In the cases where the metal nanoparticles are deposited into a layer between the organic materials or are dispersed in the polymer, the current flow paths become random and thus are incontrollable, consequently obtaining poor reproducibility and nonuniform performance.

OBJECTS AND SUMMARY

Accordingly, embodiments of the present invention have been made keeping in mind the above problems occurring in the related art, and an object of embodiments of the present invention is to provide a memory device, in which metal nanoparticles or metal ions to make current flow possible are fed into nanochannels, forming a memory layer, which is then used to ensure uniform charge transfer paths, thus manifesting excellent reproducibility and uniform performance.

According to an aspect of embodiments of the present invention to accomplish the above object, there is provided a memory device in which a memory layer having metal nanoparticles or metal ions fed into nanochannels is disposed between an upper electrode and a lower electrode.

According to another aspect of embodiments of the present invention, there is provided a method of manufacturing a memory device including a memory layer between an upper electrode and a lower electrode, comprising applying the memory layer on the lower electrode using a mesoporous material to form nanochannels; feeding metal nanoparticles or metal ions into the nanochannels; and depositing the upper electrode on the memory layer.

BRIEF DESCRIPTION OF THE DRAWINGS

The above and other objects, features and advantages of embodiments of the present invention will be more clearly understood from the following detailed description taken in conjunction with the accompanying drawings, in which.

DETAILED DESCRIPTION OF THE PREFERRED EMBODIMENTS

Hereinafter, a detailed description will be given of embodiments of the present invention, with reference to the appended drawings.

Figure 1:
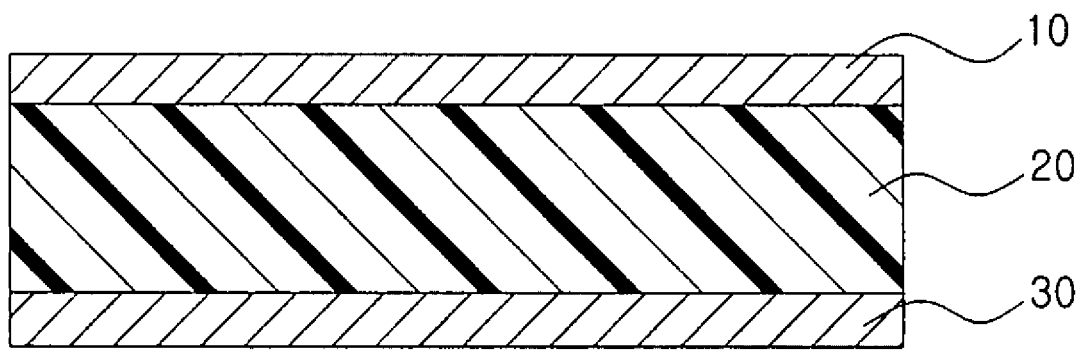
FIG. 1 is a sectional view schematically showing a memory device according to embodiments of the present invention.

FIG. 1 is a schematic sectional view showing a memory device 1 according to embodiments of the present invention. As shown in FIG. 1, a memory device 1 of embodiments of the present invention includes an upper electrode 10, a lower electrode 30, and a memory layer 20 sandwiched between the upper electrode 10 and the lower electrode 30. Specifically, the memory layer 20 is formed of a mesoporous material, and thus, has nanochannels therein. As such, metal nanoparticles or metal ions to make current flow possible are fed into the nanochannels, thus forming current flow paths. That is, when voltage is applied to the memory device 1, the resistance value of the memory layer 20 manifests bistability, and realizes memory properties. Further, since the memory properties, caused by the metal nanoparticles or metal ions in the memory layer 20, are maintained even without the upper and lower electrodes 10 and 30, a memory device 1 of embodiments of the present invention may exhibit nonvolatile properties.

In embodiments of the present invention, the memory layer 20 of the memory device 1, which includes the nanochannels and various functional materials fed into the nanochannels, may be designed on a suitable substrate (not shown), such as glass or silicon.

Used in the memory layer 20, the mesoporous material acts as a matrix-forming material to form channels in the matrix. As such, the mesoporous material may include an organic material, an inorganic material, or an organic-inorganic composite, but is not limited thereto.

For example, a method of forming regular nanopores in an organic-inorganic composite may be described as follows. That is, when an amphiphilic surfactant having hydrophilicity and hydrophobicity is used, microscopic phase separation occurs due to the difference in polarity, and thus, micelles are formed, thereby obtaining a self-assembled structure. Hence, a mesoporous thin film having regular pores of various sizes and structures may be formed by controlling the molecular weights and concentrations of a hydrophilic group and a hydrophobic group.

The mesoporous organic material may include, for example, a block copolymer having pores formed in a matrix, or a mesoporous polymer prepared by polymerizing a polymer in a regularly arranged mesoporous silica nanolith, but is not limited thereto. Further, as the mesoporous inorganic material, any material may be used without particular limitation as long as it may have pores formed in a matrix, as in the mesoporous organic material. Specifically, the inorganic material may be exemplified by $TiO_2$, ZnO, CuO, $SiO_2$, $Al_2O_3$, etc., and may be formed using a conventional process. More preferably, anodized aluminum oxide or titanium oxide may be used.

In embodiments of the present invention, nanosized channels are formed in the matrix using the mesoporous material. Such a nanochannel is a space in which metal nanoparticles or metal ions to make charge transfer possible are present, and is used to realize the memory properties of the device of embodiments of the present invention. The channel preferably has a size from 0.5 to 100 nm.

Particularly, in a memory device of embodiments of the present invention, charge transfer paths may be regularly formed since metal nanoparticles or metal ions are present in the nanochannels of the matrix. Thereby, a memory device of embodiments of the present invention may manifest excellent reproducibility and uniform performance.

The mesoporous material may undergo thermal deposition, sputtering, e-beam evaporation, spin coating, inkjet printing, or roll-to-roll coating, depending on the properties of the material used, to form the matrix of the memory layer. The memory layer preferably has a thickness of 10 nm to 100 µm.

In the memory layer, the metal nanoparticles or metal ions may be fed in such a manner that they are randomly arranged or arranged perpendicular to the surface of the upper or lower electrode, depending on the shape of the nanochannel of the matrix. Further, the metal nanoparticles or metal ions in the nanochannels may cause the resistance values of the device to have bistability, corresponding to the applied voltage, to realize the memory properties of a memory device of embodiments of the present invention. Furthermore, since they may function as a charge transfer path in a memory device of embodiments of the present invention, a conductive polymer, a semiconductive polymer, or a semiconductive inorganic material need not be additionally included. As a specific material acting as the charge transfer path, nanoparticles or ions of aluminum, gold, silver, platinum, copper, indium fin oxide, etc., may be exemplified, but are not limited thereto.

Although the size of metal nanoparticles is not particularly limited, it is preferably in the range of 10 nm or less.

The metal nanoparticles or metal ions may be fed into the nanochannels in the matrix according to various processes. Specifically, the metal nanoparticles or metal ions may be simply and directly fed using vacuum deposition over a memory layer having nanochannels. In particular, in the case where the nanochannel is an open pore structure, the above process is generally more effective. In some cases, when the upper electrode is deposited, particles or ions of metal for the electrode may be fed into pores via metal diffusion. In this way, the process of feeding metal nanoparticles or metal ions is not additionally performed, and may be simultaneously performed when the upper electrode is formed on the memory layer. Alternatively, a polymer having metal situated thereon may be fed into the nanochannel, or a functional material may be deposited on the nanochannel using CVD as an adjuvant process.

The amount or distribution of the fed metal nanoparticles or metal ions may vary with the types of metal and the memory properties, and also, may be more easily controlled by selectively forming a barrier layer between the memory layer and the electrode. In particular, in the case where the metal nanoparticles or metal ions are fed into nanochannels via diffusion while the upper electrode is deposited using vacuum deposition, the formation of a barrier layer between the memory layer and the upper electrode is preferred to control the amount and the distribution of the metal nanoparticles or metal ions.

Figure 2A:
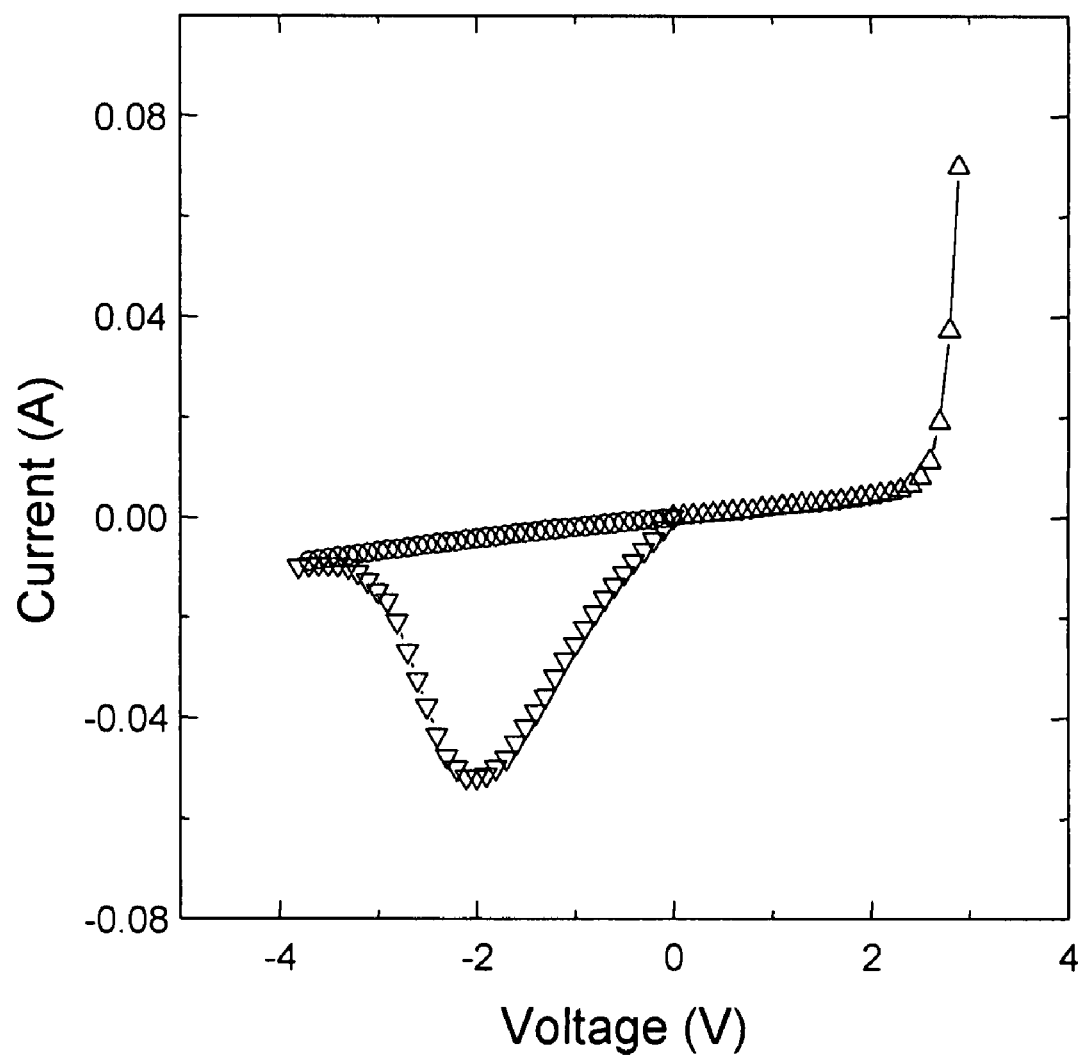
FIGS. 2a and 2b are current-voltage graphs showing a bell type memory phenomenon and a fast switching type memory phenomenon, respectively, of the memory device, according to embodiments of the present invention.
Figure 2B:
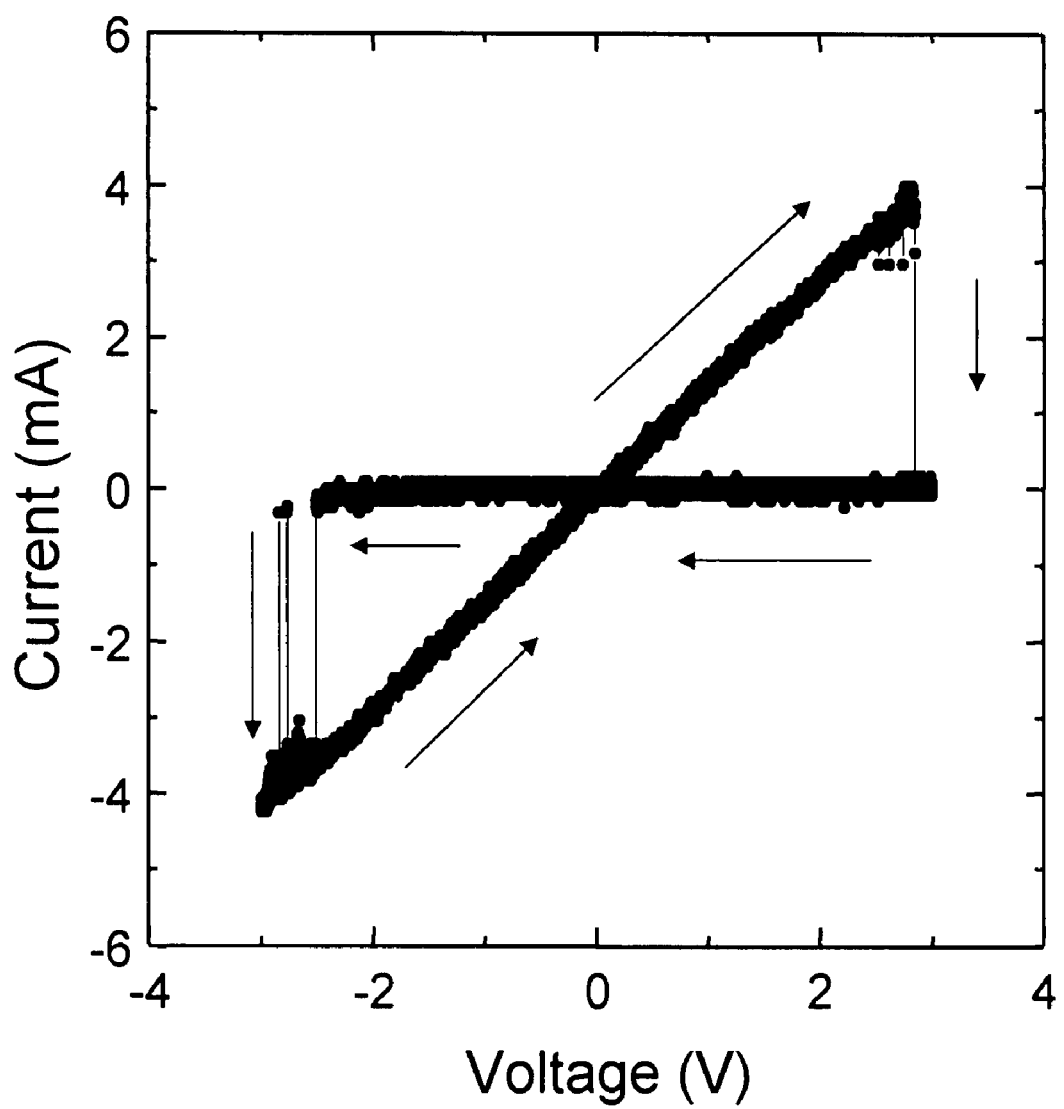

As mentioned above, in a memory device of embodiments of the present invention, the fed metal nanoparticles or metal ions may be caused to form current flow paths and manifest memory properties. Specifically, when the metal nanoparticles in the matrix are distributed perpendicular to the electrode, negative differential resistance occurs and thus bell type nonvolatile memory properties may be realized, as is apparent from FIG. 2a. In addition, when the metal ions drift in the matrix, fast switching type nonvolatile memory properties may be exhibited, due to the formation of metal filaments or the generation of a short circuit, as shown in FIG. 2b.

In embodiments of the present invention, the upper electrode 10 and the lower electrode 30 may be formed of an electrical conductive material selected from the group consisting of metals, metal alloys, metal nitrides, metal oxides, metal sulfides, carbon, conductive polymers, organic conductors, and mixtures thereof, but are not limited thereto. Specifically, the electrode material may include, for example, aluminum, gold, silver, platinum, copper, titanium, tungsten, and indium tin oxide. The upper metal material may act as metal nanoparticles or metal ions in the nanochannels of the memory layer via the metal diffusion using vacuum deposition.

While the relationship in current-voltage of a memory device varies with the material for the upper electrode, the memory properties may be controlled.

In a preferred embodiment of the present invention, a memory device may further include a barrier layer on the lower electrode or below the upper electrode, to control the amount and distribution of the metal nanoparticles or metal ions fed into the nanochannels. That is, before the upper electrode is deposited, a barrier layer may be deposited on the memory layer, and thus, the material for the barrier layer is deposited even in the nanochannels formed in the memory layer, decreasing the diameter of the nanochannel. As a result, upon the subsequent formation of the upper electrode, the amount of the metal nanoparticles or metal ions included in the nanochannels may be controlled.

Although the material for the barrier layer is not particularly limited, it may be selected from the group consisting of a conductive polymer, a nonconducive polymer, a mesoporous material different from the material used in the memory layer, an organic monomer or an inorganic material able to be formed into a thin film using vacuum deposition, and mixtures thereof.

Preferably, the conductive polymer may be at least one homopolymer or copolymer selected from the group consisting of poly(n-vinylpyridine), poly(dimethylsiloxane), poly (ethylene-oxide), poly(acrylic acid), poly(methylacrylic acid), poly(styrene-sulfonic acid), poly(cyclopentadienylmethyl-norbomene), and poly(amino acid). The nonconductive polymer may be at least one homopolymer or copolymer selected from the group consisting of polymethylmethacrylate (PMMA), polystyrene (PS), polyimide (PI), and polycarbonate (PC). Also, the mesoporous material different from the material used in the memory layer may include mesoporous thin films prepared by using siloxane or silsesquioxane as a matrix material and using cyclodextrin, a calix arene compound, or dendrimer as a pore-forming material. The more regularly arranged mesoporous material may include mesoporous thin films prepared by using a silica matrix or a block terpolymer of polyethyleneoxide/polypropyleneoxide/polyethyleneoxide (PEO-PPO-PEO) as a matrix and using a surfactant as a pore-forming material.

The above-mentioned materials may be used to prepare a thin film using spin coating, or to form a thin barrier film using vacuum deposition.

For example, acetylene gas may be deposited using CVD to form a carbon layer. Alternatively, a conductive monomer, such as Alq3 (8-hydroxyquinoline aluminum), or TPD (N,N-diphenyl-N,N'-bis(3-methylphenyl)-1,1'-biphenyl-4,4'-diamine), may be deposited using the same process.

Although the thickness of the barrier layer is not particularly limited, it preferably ranges from 0.1 to 100 nm.

A better understanding of embodiments of the present invention may be obtained in light of the following examples which are set forth to illustrate, but are not to be construed to limit embodiments of the present invention.

EXAMPLE 1

Figure 3:
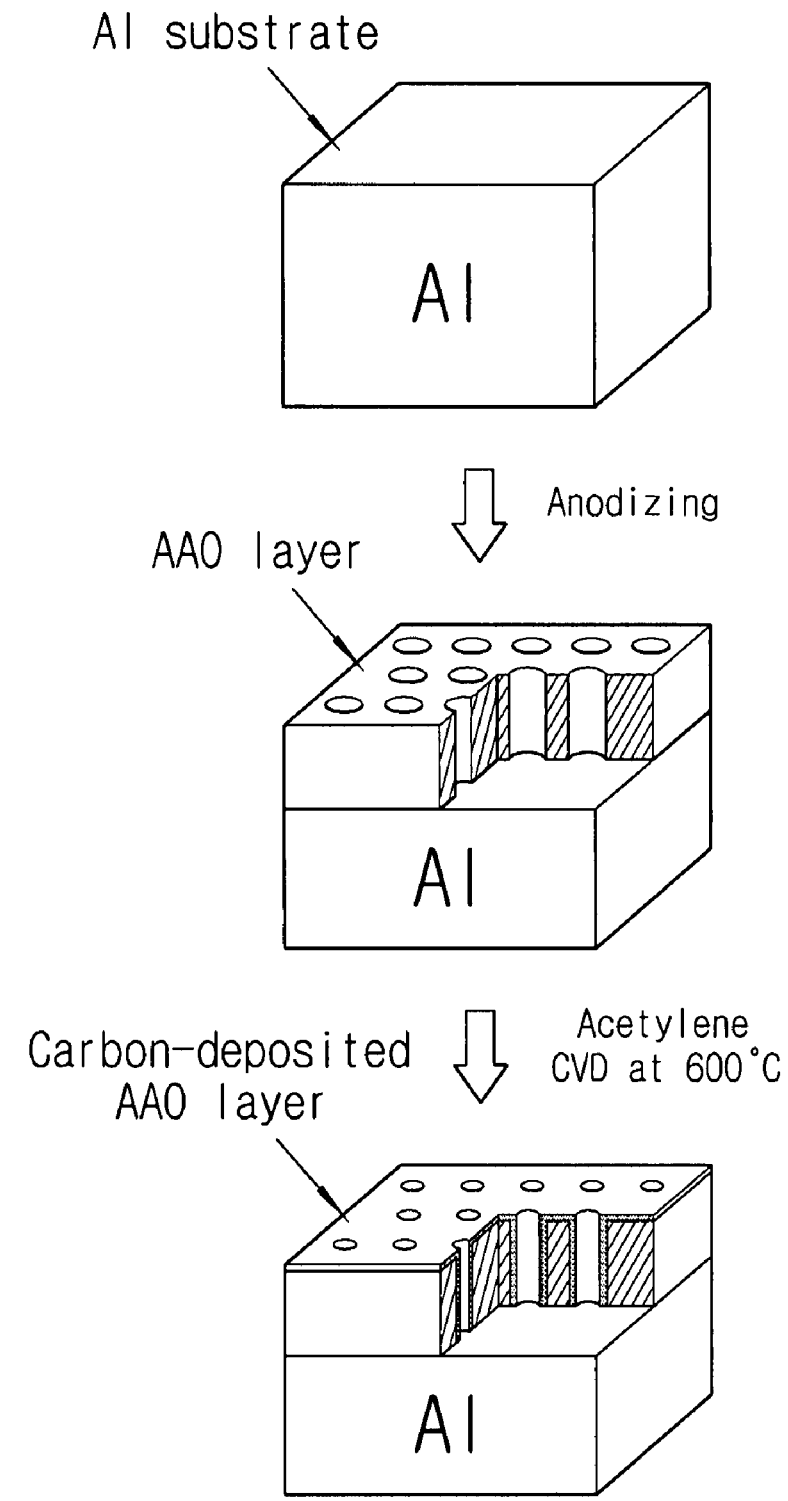
FIG. 3 is a view schematically showing the process of manufacturing a memory device using AAO (Anodized Aluminum Oxide) in Example 1.

According to the process shown in FIG. 3, a memory device using anodized aluminum oxide (AAO) was manufactured as follows. Al was deposited to a thickness of 1000 nm on a 4" Si wafer having $SiO_2$ deposited to a 300 nm thickness, using an e-beam evaporator. Then, a reactor including sulfuric acid as an electrolyte and in which a platinum (Pt) plate was mounted as a cathode and the Al film cut to a suitable size was mounted as an anode, was stabilized at 0° C. The voltage of 25 V was applied to the above reactor, and anodic oxidation occurred for 8 min.

The AAO/Al film thus obtained was completely washed with distilled water, and then dipped into an etching solution comprising phosphoric acid and chromic acid mixed at 1.6:1.8 at 60° C. for 20 min, to remove the upper AAO layer. The etched Al film was loaded into an anodizing reactor, to which 25 V were applied, and the anodic oxidation took place for 8 min, to obtain a 500 nm thick AAO film.

On the AAO film thus obtained, carbon was deposited from acetylene gas using a CVD apparatus at 600° C. to form a carbon layer in the nanopores and on the film. As a result, a semi-diameter of the pore on the film was decreased from 10 nm to 1-2 nm.

Figure 4:
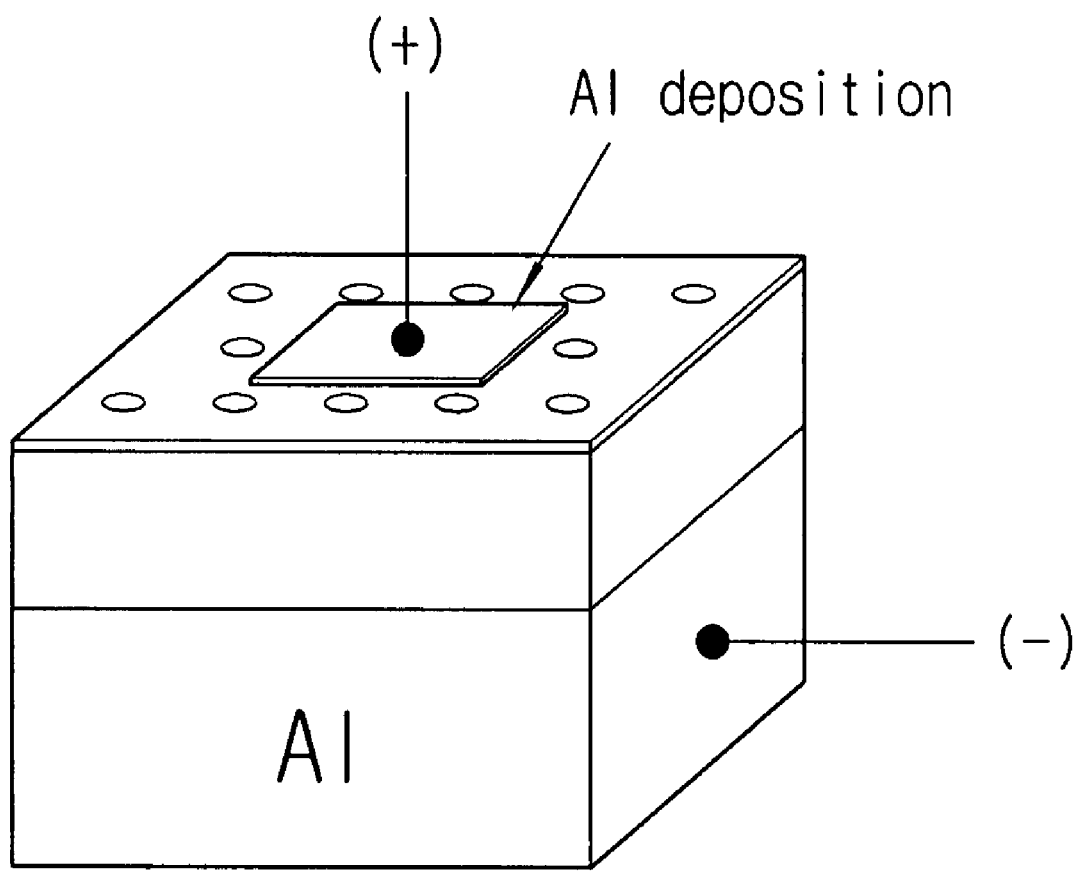
FIG. 4 is a perspective view showing the nonvolatile nanochannel memory device, manufactured using AAO in Example 1.
Figure 5:
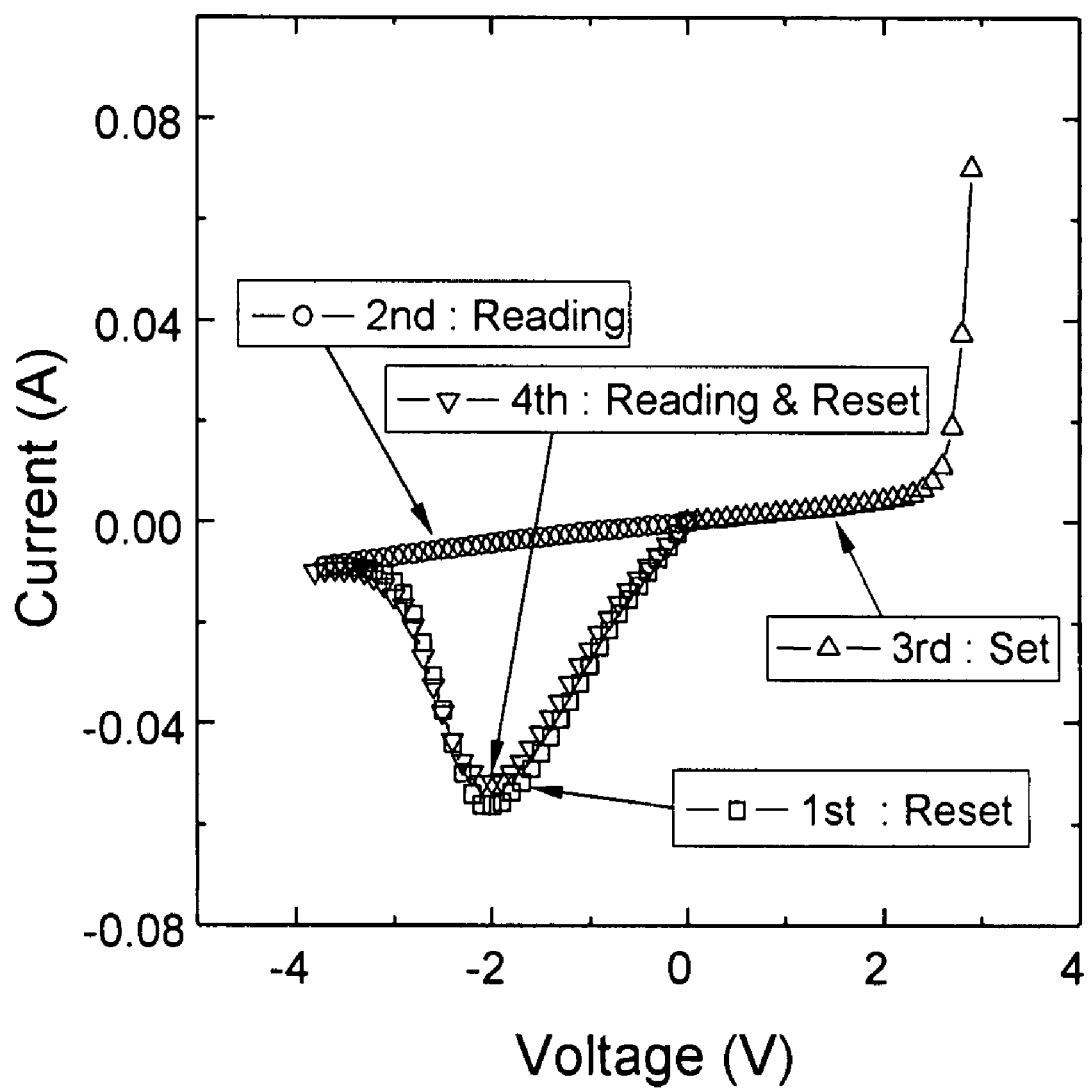
FIG. 5 is a current-voltage graph showing the memory properties of the AAO memory device, manufactured in Example 1.

On the AAO film thus treated, an Al upper electrode was deposited to a size of 2×2 $mm^2$ and to a thickness of 80 nm using thermal vacuum deposition, to complete a memory device, which was then measured for current-voltage properties. FIG. 4 is a perspective view showing the nonvolatile nanochannel memory device. The results are shown in FIG. 5. At a first scan, while the current was drastically decreased at about −2 V, NDR (negative differential resistance) was shown, and the device was switched to a high resistance state (reset state). Then, when the device was scanned again to a positive voltage, the current was drastically increased at 3 V. As such, the resistance decreased and thus the device was to be a set state. Further, when the device was scanned again to a negative voltage, the NDR phenomenon as in the first scan was shown, and the device was switched to a reset state.

Figure 6A:
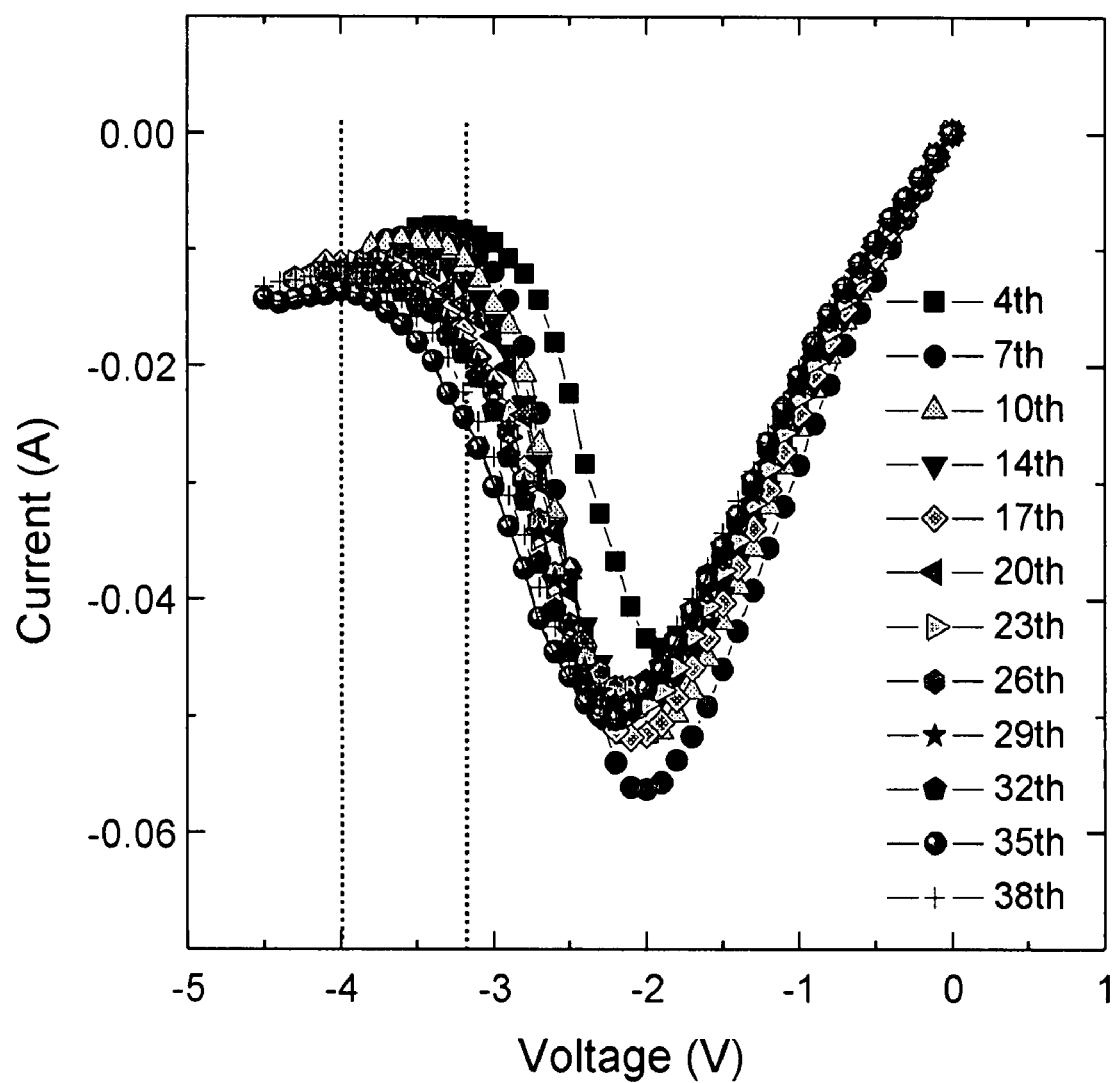
FIGS. 6a and 6b are graphs continuously showing the memory properties of a reset state and a set state of the AAO memory device, manufactured in Example 1.
Figure 6B:
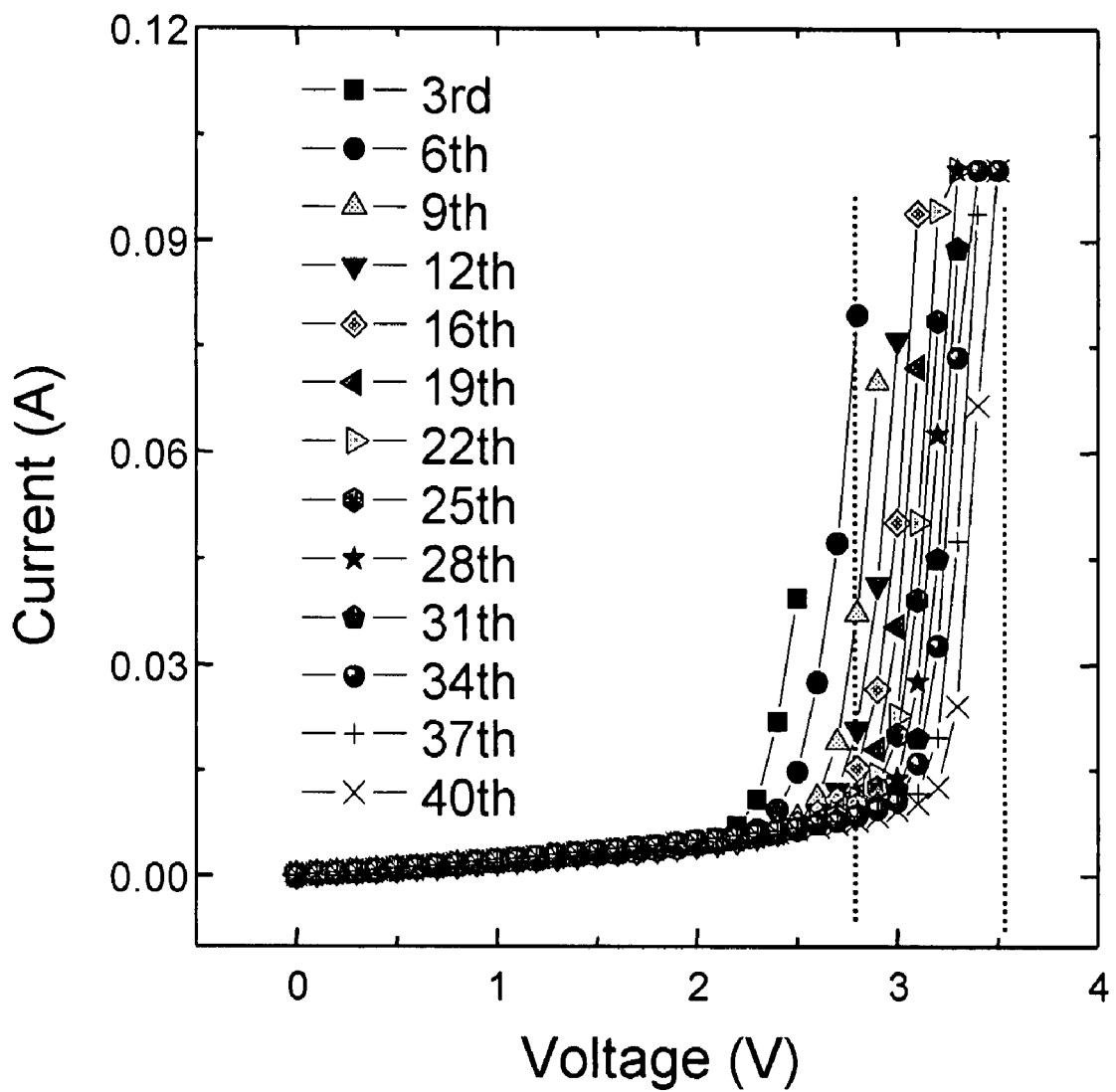

FIGS. 6a and 6b show the results of continuous observation of the switching phenomena. FIG. 6a shows reset switching and FIG. 6b shows set switching. The two different resistance states may be read at a low reading voltage. Thus, the above device is confirmed to be usable as a desired memory device.

EXAMPLE 2

Figure 7:
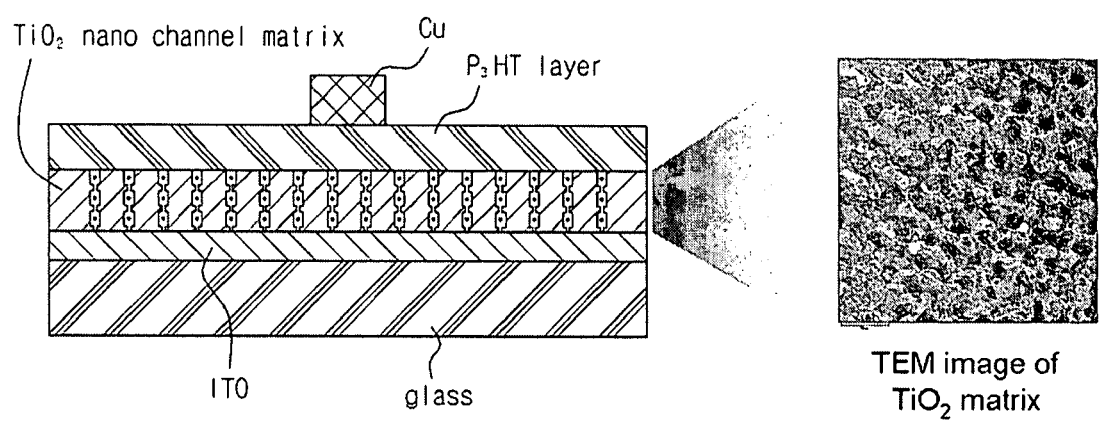
FIG. 7 is a sectional view showing the nonvolatile nanochannel memory device, manufactured using $TiO_2$ in Example 2.

As in the structure shown in FIG. 7, pores were formed using $TiO_2$, which were then formed into nanochannels, after which a memory device was manufactured according to the following procedures.

4.3 g of $Ti(OEt)_4$ and excess deionized water were loaded into a 50 ml centrifuge tube, and then stirred and hydrated in the form of particles. Centrifuging was performed at 4000 rpm for 5 min, and water as a supernatant was decanted. Subsequently, the hydrated titanium particles were allowed to stand at room temperature for 5 min and then washed with excess acetone. After upper acetone was removed, white powdered hydrated titanium particles were sufficiently dried at room temperature, added with 2.6 g of concentrated HCl, and stirred at room temperature for 30 min, to obtain a transparent titanium hydroxide sol precursor.

0.8 g of P123 (available from BASF), typically represented by an amphiphilic surfactant, and 10 g of ethanol were mixed, loaded into a 20 cc glass vial, and stirred for 30 min until completely dissolved and transparent.

Subsequently, the above two solutions were mixed, and stirred at room temperature for 30 min. The mixture solution was loaded into a refrigerator, and allowed to stand for 4 hr therein to be thick to the extent of being applied. The resultant Ti precursor was applied on a suitable substrate using spin coating, to form a film, which was then dried and cured at 40-60° C. for 12 hr on a hot plate in a nitrogen atmosphere. Then, the film was loaded into a duct furnace, and the temperature was gradually increased to 400° C. at a rate of 1° C./min, and the film was completely calcined at 400° C.

On the resultant film, polythiophene was applied to a thickness of 20 nm using spin coating. Further, Al and Cu serving as an upper electrode were each deposited to a size of 2×2 $mm^2$ and a thickness of 80 nm using thermal vacuum deposition, to obtain a desired memory device, which was then measured for current-voltage properties.

Figure 8A:
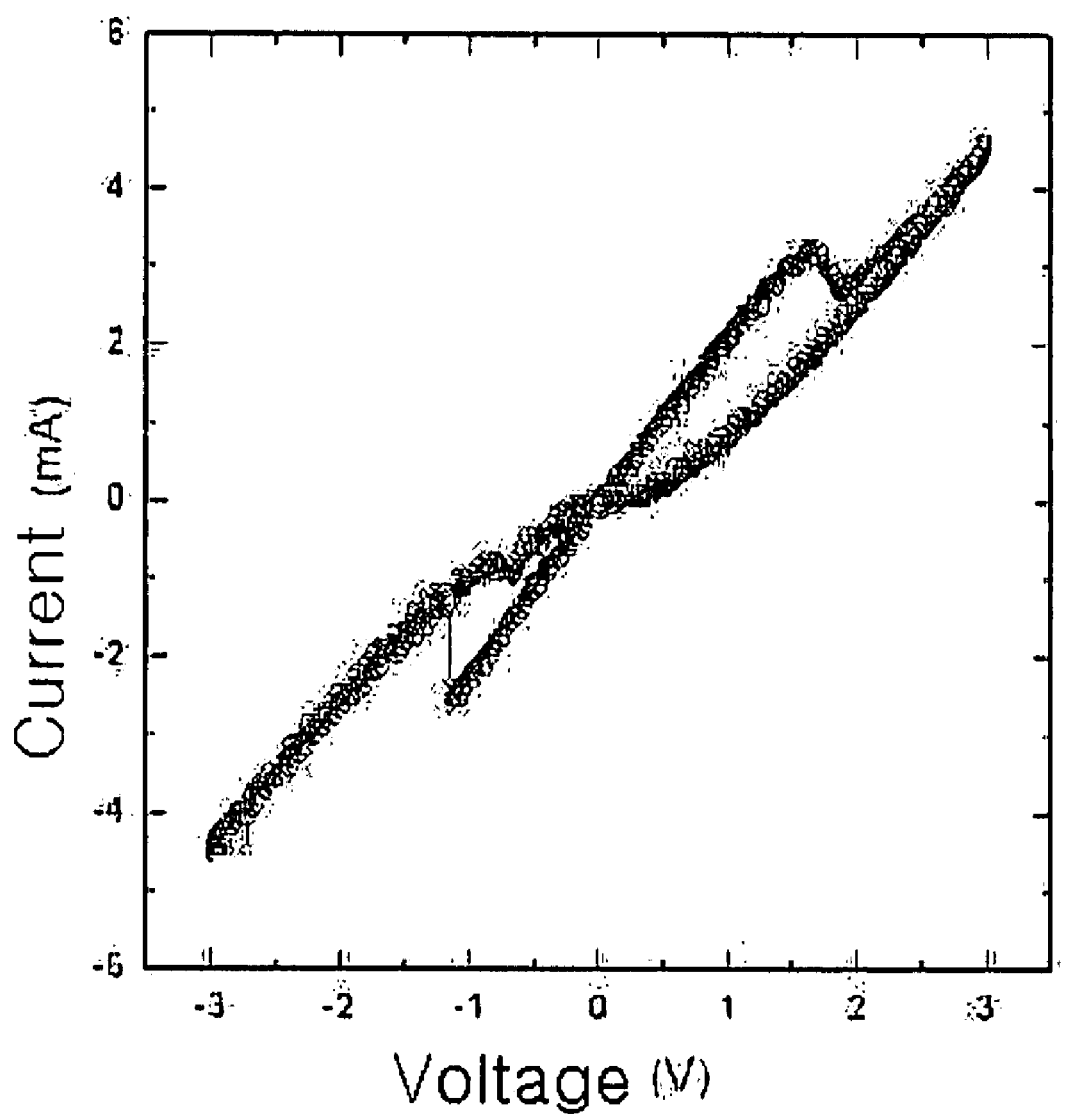
FIGS. 8a and 8b are current-voltage graphs showing the memory properties of the $TiO_2$ memory device, manufactured using Al and Cu as an upper electrode in Example 2.
Figure 8B:
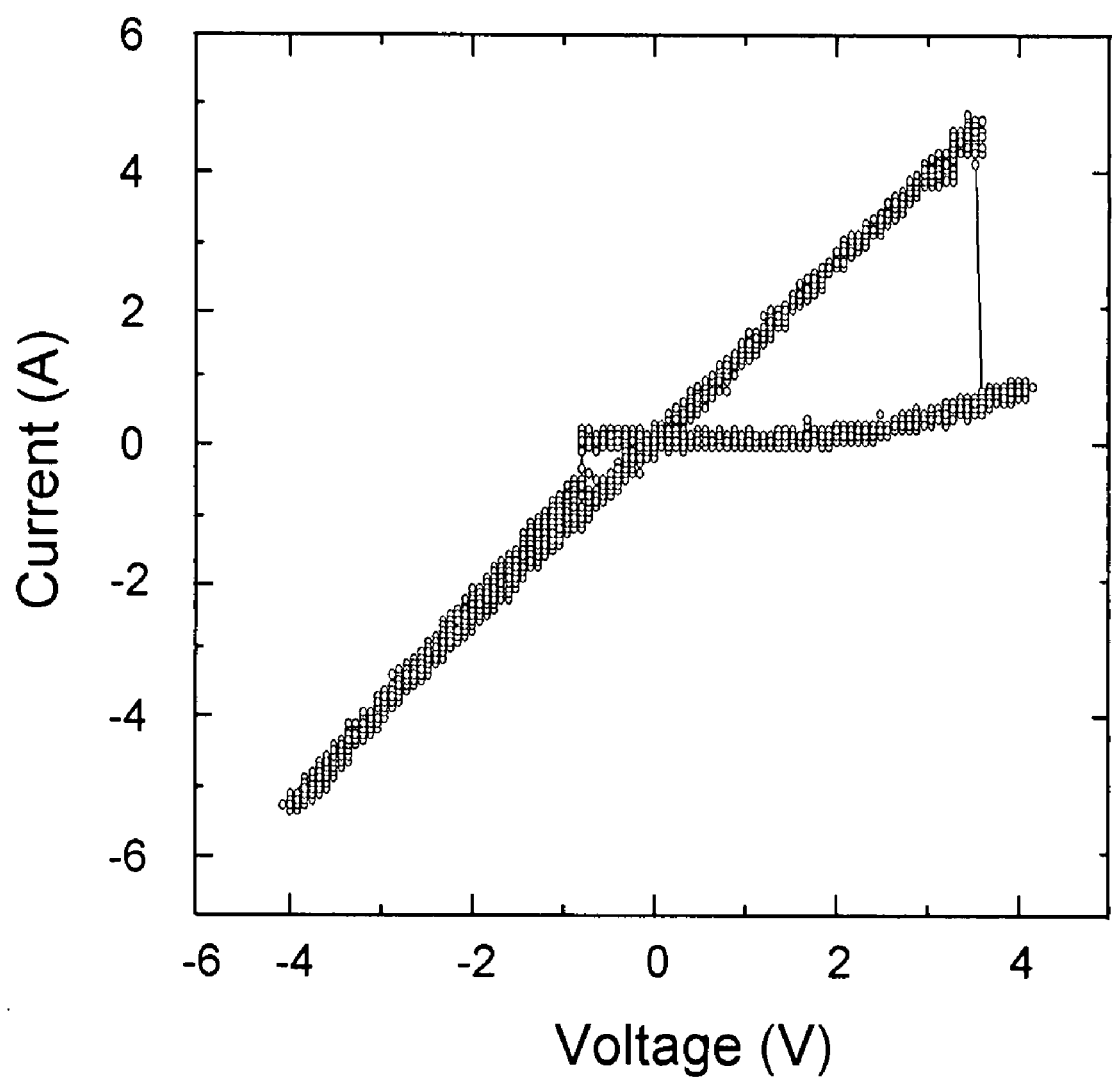

The results are shown in FIGS. 8a and 8b. FIG. 8a shows the results when using Al as an upper electrode, and FIG. 8b shows the results when using Cu as an upper electrode. As is apparent from FIG. 8a using Al as an upper electrode, the device was switched to a high resistance state (reset state), while manifesting a weak NDR phenomenon at about 1.5 V. When the device was scanned to a negative voltage, it was switched to a low resistance state (set state). As such, the resistance values of two states were 440Ω and 1.6 kΩ. As such, there was about 4 times difference between the two resistance values. In FIG. 8b using Cu as an upper electrode, fast switching occurred, unlike FIG. 8a. The device was switched to high resistance at 3.5 V, and then switched again to low resistance at −1 V.

As described hereinbefore, embodiments of the present invention provide a nonvolatile nanochannel memory device using a mesoporous material. A nanochannel memory device of embodiments of the present invention may exhibit nonvolatile properties, and be inexpensively manufactured through a simple process while realizing high capacity due to high integration. Further, in the memory device, since metal nanoparticles or metal ions are present in the nanochannels, charge transfer paths may be regularly formed, therefore obtaining excellent reproducibility and uniform performance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising:
   a first electrode;
   a second electrode; and
   a memory layer disposed between the first and second electrodes, wherein the memory layer includes a mesoporous material and nanochannels, the nanochannels being comprised of metal nanoparticles or metal ions, and the memory layer showing bistable resistance values; and
   a barrier layer disposed between the memory layer and the second electrode to control the concentration and distribution of the metal nanoparticles or metal ions in the nanochannels,
   wherein the barrier layer is formed on top of the nanochannels of the memory device, the barrier layer being configured such that the metal nanoparticles or metal ions can be fed into the nanochannels through the barrier layer.

2. The memory device as set forth in claim 1, wherein the mesoporous material is an organic material, an inorganic material, or an organic-inorganic composite.

3. The memory device as set forth in claim 1, wherein the mesoporous material is an inorganic material.

4. The memory device as set forth in claim 3, wherein the inorganic material is at least one selected from the group consisting of $TiO_2$, ZnO, CuO, $SiO_2$, $Al_2O_3$, and mixtures thereof.

5. The memory device as set forth in claim 1, wherein the nanochannels have a size from 0.5 to 100 nm in diameter.

6. The memory device as set forth in claim 1, wherein the memory layer is formed by subjecting the mesoporous material to thermal deposition, sputtering, e-beam evaporation, spin coating, inkjet printing, or roll-to-roll coating.

7. The memory device as set forth in claim 1, wherein the memory layer has a thickness ranging from 10 nm to 100 μm.

8. The memory device as set forth in claim 1, wherein the metal nanoparticles or metal ions are nanoparticles or ions of a metal selected from the group consisting of aluminum, gold, silver, platinum, and indium tin oxide.

9. The memory device as set forth in claim 1, wherein the metal nanoparticles have a size of 10 nm or less in diameter.

10. The memory device as set forth in claim 1, wherein the metal nanoparticles or metal ions are fed into the nanochannels using thermal deposition.

11. The memory device as set forth in claim 10, wherein the metal nanoparticles or metal ions are fed into the nanochannels via metal diffusion while depositing the upper electrode using thermal deposition.

12. The memory device as set forth in claim 1, wherein the barrier layer is formed of a material selected from the group consisting of a conductive polymer, a nonconductive polymer, a mesoporous material different from the mesoporous material used in the memory layer, and an organic monomer or an inorganic material able to be formed into a thin film using thermal deposition.

13. The memory device as set forth in claim 11, wherein the barrier layer is formed of a material selected from the group consisting of a conductive polymer, a nonconductive polymer, a mesoporous material different from the mesoporous material used in the memory layer, and an organic monomer or an inorganic material able to be formed into a thin film using thermal deposition.

14. The memory device as set forth in claim 12, wherein the conductive polymer is at least one homopolymer or copolymer selected from the group consisting of poly(n-vinylpyridine), poly(dimethylsiloxane), poly(ethylene-oxide), poly(acrylic acid), poly(methylacrylic acid), poly(styrenesulfonic acid), poly(cyclopentadienylmethyl-norbornene), and poly(amino acid), the nonconductive polymer is at least one homopolymer or copolymer selected from the group consisting of polymethylmethacrylate (PMMA), polystyrene (PS), polyimide (PI), and polycarbonate (PC), the mesoporous material different from the mesoporous material used in the memory layer is any one selected from the group consisting of thin films prepared by using siloxane or silsesquioxane as a matrix and using cyclodextrin, calix arene, or dendrimer as a pore-forming material, and thin films prepared by using silica or a block terpolymer of polyethyleneoxide /polypropyleneoxide/polyethyleneoxide (PEO-PPO-PEO) as a matrix and using a surfactant as a pore-forming material, and the organic monomer able to be formed into a thin film using vacuum deposition is acetylene, Alq3 (8-hydroxyquinoline aluminum), or TPD (N,N-diphenyl-N,N'-bis (3-methylphenyl)-1,1'-biphenyl-4,4'-diamine).

15. The memory device as set forth in claim 13, wherein the conductive polymer is at least one homopolymer or copolymer selected from the group consisting of poly(n-vinylpyridine), poly(dimethylsiloxane), poly(ethylene-oxide), poly(acrylic acid), poly(methylacrylic acid), poly(styrenesulfonic acid), poly(cyclopentadienylmethyl-norbornene), and poly(amino acid), the nonconductive polymer is at least one homopolymer or copolymer selected from the group consisting of polymethylmethacrylate (PMMA), polystyrene (PS), polyimide (PI), and polycarbonate (PC), the mesoporous material different from the mesoporous material used in the memory layer is any one selected from the group consisting of thin films prepared by using siloxane or silsesquioxane as a matrix and using cyclodextrin, calix arene, or dendrimer as a pore-forming material, and thin films prepared by using silica or a block terpolymer of polyethyleneoxide/polypropyleneoxide/polyethyleneoxide (PEO-PPO-PEO) as a matrix and using a surfactant as a pore-forming material, and the organic monomer able to be formed into a thin film using vacuum deposition is acetylene, Alq3 (8-hydroxyquinoline aluminum), or TPD (N,N-diphenyl-N,N'-bis (3-methylphenyl)-1,1'-biphenyl-4,4'-diamine).

16. The memory device as set forth in claim 1, wherein the barrier layer has a thickness ranging from 0.1 to 100 nm.

17. The memory device as set forth in claim 11, wherein the baffler layer has a thickness ranging from 0.1 to 100 nm.

18. The memory device as set forth in claim 1, wherein the first and second electrodes are formed of at least one material selected from the group consisting of metals, metal alloys, metal nitrides, metal oxides, metal sulfides, carbon, conductive polymers, organic conductors, and mixtures thereof.

19. The memory device as set forth in claim 18, wherein the metal is selected from the group consisting of aluminum, gold, silver, platinum, and indium tin oxide.

* * * * *